(12) United States Patent
He

(10) Patent No.: US 12,147,378 B2
(45) Date of Patent: Nov. 19, 2024

(54) I2C WAKEUP CIRCUIT, WAKEUP METHOD AND ELECTRONIC DEVICE

(71) Applicant: GIGADEVICE SEMICONDUCTOR (XIAN) INC., Xi'an (CN)

(72) Inventor: Ze He, Xi'an (CN)

(73) Assignee: GIGADEVICE SEMICONDUCTOR (XIAN) INC., Xi'an (CN)

( * ) Notice: Subject to any disclaimer, the term of this patent is extended or adjusted under 35 U.S.C. 154(b) by 61 days.

(21) Appl. No.: 18/078,938

(22) Filed: Dec. 10, 2022

(65) Prior Publication Data

US 2023/0222086 A1 Jul. 13, 2023

(30) Foreign Application Priority Data

Jan. 12, 2022 (CN) .......................... 202210033143.7

(51) Int. Cl.
*G06F 13/42* (2006.01)
*H03K 5/125* (2006.01)

(52) U.S. Cl.
CPC ......... *G06F 13/4291* (2013.01); *H03K 5/125* (2013.01); *G06F 2213/0016* (2013.01)

(58) Field of Classification Search
CPC ......... G06F 13/4291; G06F 2213/0016; G06F 13/4282; G06F 9/4418; H03K 5/125; Y02D 10/00
See application file for complete search history.

(56) References Cited

U.S. PATENT DOCUMENTS

2020/0065116 A1* 2/2020 Fu .......................... G06F 9/4418
2020/0272592 A1* 8/2020 Chan .................... G06F 13/4282

* cited by examiner

*Primary Examiner* — Henry Tsai
*Assistant Examiner* — Kim T Huynh
(74) *Attorney, Agent, or Firm* — IPro, PLLC

(57) ABSTRACT

An I2C wake-up circuit, method and electronic device are disclosed. The I2C wake-up circuit includes: a clock wake-up circuit, configured to send a clock wake-up signal to a clock circuit in response to detecting a start signal on a serial clock line SCL and a serial data line SDA; and a signal hold circuit, configured to hold the serial data line SDA in a state of not transmitting address information until a clock signal sent by the clock circuit that is wake-up is received. The present I2C wake-up solution can realize normal data reception through a simple hardware circuit without a specific address wake-up and maximize power saving by turning on the clock when there is access and turning off the clock when the access ends.

17 Claims, 3 Drawing Sheets

I2C WAKEUP CIRCUIT, WAKEUP METHOD AND ELECTRONIC DEVICE

CROSS-REFERENCE TO RELATED APPLICATIONS

This application claims priority to a Chinese patent application No. 202210033143.7 filed on Jan. 12, 2022, the disclosure of which is incorporated herein by reference in its entirety.

TECHNICAL FIELD

The disclosure herein relates to the field of electronic communication, and in particular, to an I2C wake-up circuit, method and electronic device.

BACKGROUND

In order to further reduce the power consumption of a microprocessor (MCU), a clock source needs to be turned off in a low power mode, but the I2C needs to be accessed normally in the low power mode. If a SCL is used as a clock, a large amount of signal synchronization overhead will be generated due to the increase of the clock domain. If the SCL is used as a data line, complex address matching and clock wake-up mechanisms are required.

Thus, an improved I2C wake-up solution is required.

SUMMARY

A technical problem to be solved by the present disclosure is to provide an improved I2C wake-up solution, which wakes up the clock by detecting a start signal and prevents a master from sending subsequent messages before the clock circuit wakes up to prevent data loss, thereby ensuring that the normal communication of I2C is not affected by the clock wake-up.

According to a first aspect of the present disclosure, an I2C wake-up circuit is provided, comprising: a clock wake-up circuit, configured to send a clock wake-up signal to a clock circuit in response to detecting a start signal on a serial clock line SCL and a serial data line SDA; and a signal holding circuit, configured to hold the serial data line SDA in a state of not transmitting address information until a clock signal sent by the clock circuit that is awakened is received.

According to a second aspect of the present disclosure, an I2C wake-up method is provided, wherein the method comprises the following steps: sending a clock wake-up signal to ta clock circuit in response to detecting a start signal on a serial clock line SCL and a serial data line SDA; and holding the SDA in a state of not transmitting address information until a clock signal sent by the clock circuit that is awakened is received.

According to a third aspect of the present disclosure, an electronic device is provided, the electronic device comprises the I2C wake-up circuit according to the first aspect of the present disclosure.

Therefore, the I2C wake-up solution of the present disclosure can realize normal data reception without a specific address wake up through a simple hardware circuit, and maximize power saving by turning on the clock when there is access and turning off the clock when the access ends.

BRIEF DESCRIPTION OF FIGURES

The above and other objects, features and advantages of the present disclosure will become more apparent from the more detailed description of the exemplary embodiments of the present disclosure taken in conjunction with the accompanying drawings, wherein the same reference numerals generally refer to the same parts, in exemplary embodiments of the present disclosure.

DETAILED DESCRIPTION

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I2C (Inter-Integrated Circuit) is the abbreviation of I2C Bus (Integrated Circuit Bus), and is a serial communication bus. It uses a multi-master-slave architecture and is currently widely used in the communication between multiple ICs in the system.

Figure 1:
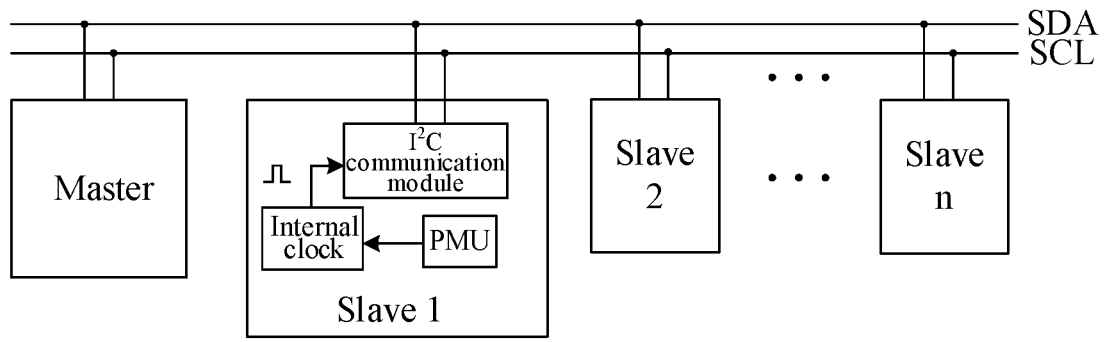
FIG. 1 shows a system architecture diagram using a I2C bus.

FIG. 1 shows a system architecture diagram using a I2C bus. As shown in the figure, I2C includes a bidirectional serial data line SDA and a serial clock line SCL. Each device connected to the bus has an independent address through which a master can access different devices. The master sends the device address (SLAVE_ADDRESS) through the SDA line to find the slave. SLAVE_ADDRESS can be 7-bit or 10-bit, followed by a data bit to indicate the data transmission direction, that is, the 8th or 11th bit. When the data bit is 0, it means write data, and when the data bit is 1, it means read data.

Figure 2:
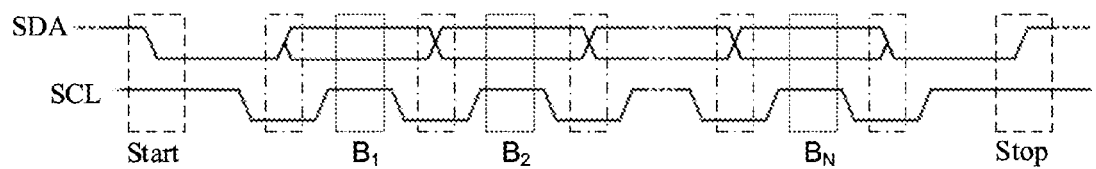
FIG. 2 shows a SCL and SDA timing diagram for data validity.

FIG. 2 shows the SCL and SDA timing diagram for data validity. As shown in the figure, the start condition (Start) of the transmission is that when SCL is high, SDA is converted from high to low (as shown by the dashed box on the left side of the figure). The stop condition (Stop) is that when SCL is high, SDA is converted from low to high (as shown in the dashed box on the right side of the figure). Start and stop conditions are generally generated by the master. The bus is busy after a START condition, and after a certain period of time of a STOP condition, the bus is idle again.

When performing data transmission, the data on SDA must remain stable during the high period of the clock (as shown by the dotted boxes in the figure), and the state of SDA can be changed only when the clock signal of the SCL line is low (as shown by the boxes with dots and dashed lines in the figure). In other words, when SCL is high, it means valid data, when SDA is high, it means "1", and when SDA is low, it means "0"; when SCL is low, it means invalid data, meanwhile, SDA will switch the level, which is prepare for the next data presentation.

Each byte transferred must be 8 bits, while the total number of bytes is unlimited. Each byte must be followed by a response bit. The transfer starts from the most significant bit of the data, i.e., the MSB bit. If the slave is busy with other functions, such as executing the interrupt service routine, it is necessary to keep the SCL line low to force the master to enter a wait state until the slave is ready.

After the data receiver receives a byte of data transmitted, it needs to give a response. It's the ninth clock cycle, and the sender releases the control of the SDA line, pulls the SDA level high, and make the SDA controlled by the receiver. If the transmission wants to be continued, the "acknowledge (ACK)" signal is given, that is, SDA is low; otherwise, the "non-acknowledgement (NACK)" signal is given, that is, SDA is high.

The slave 1 to the slave n shown in FIG. 1 can be implemented as independent IC chips, such as a microprocessor (MCU), in a system. Each slave can have its own I2C communication module. The internal circuits related to the I2C communication are shown in the slave 1 of FIG. 1. It should be understood that other slaves may also have circuits that perform similar functions. As shown in the figure, the I2C communication module in the slave can be connected to SDA and SCL lines in I2C, so that operations related to I2C communication can be performed, such as identifying the start condition in I2C communication, obtaining address data, and controlling subsequent transmissions, and identifying a stop condition, etc. Usually, the I2C communication module will perform related operations under the control of the internal clock circuit. However, in order to further reduce the power consumption of the microprocessor (MCU), the power management unit (PMU) in the slave will turn off the clock source in the low power consumption mode, that is, turn off the internal clock circuit. But in low power mode, I2C needs to be accessed normally. Although when the internal clock source of the slave is turned off, the I2C access can be realized by additionally setting the SCL clock domain circuit in the slave, or using SCL as a data line and additionally introducing a complex address matching and clock wake-up mechanism, the above methods all will introduce excessive overhead and affect the efficiency of the master accessing other slaves.

Thus, the present disclosure proposes an improved I2C wake-up solution, which realizes, with a simple hardware structure, the function of waking up the clock by detecting the start signal, and preventing the master from sending subsequent messages before the clock wakes up to prevent data loss, ensuring that the normal communication of I2C is not affected by the wake-up of the clock.

Figure 3:
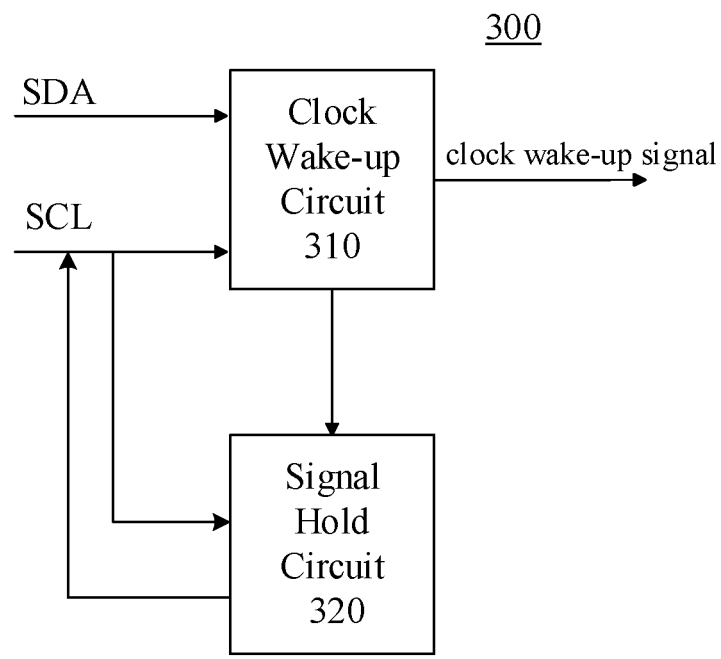
FIG. 3 shows a schematic diagram of the composition of an I2C wake-up circuit according to an embodiment of the present disclosure.

FIG. 3 shows a schematic diagram of the composition of an I2C wake-up circuit according to an embodiment of the present disclosure. As shown, the I2C wake-up circuit 300 includes a clock wake-up circuit 310 and a signal hold circuit 320. The clock wake-up circuit 310 is configured to send a clock wake-up signal to a clock circuit (not shown) in response to detecting a start signal on the serial clock line SCL and the serial data line SDA. The signal holding circuit 320 is configured to keep the serial data line SDA in a state of not sending address information until receiving the clock signal sent by the clock circuit that is awakened.

It should be understood that the I2C wake-up circuit of the present disclosure is a circuit other than the I2C communication module, the internal clock circuit and the power management circuit included in the slave shown in FIG. 1. The I2C wake-up circuit can be used to wake up the I2C communication module for I2C communication when the internal clock source is turned off in a low-power state. Specifically, the I2C wake-up circuit 300 can detect the start signal (Start) and wake up the internal clock accordingly, and make the master wait before the internal clock is awaken (i.e., before the I2C communication module can operate normally under the control of the internal clock), instead of starting the transmission of data $B_1$~$B_N$ on SDA as shown in FIG. 2.

Further, because the I2C communication protocol stipulates that the state of SDA can only be changed when the clock signal of the SCL line is low (as shown by the boxes with dots and dashed lines in FIG. 2), and it is stipulated that if the slave is busy with other functions, the SCL line can be held low to force the master into a wait state until the slave is ready. Therefore, in the present disclosure, the signal hold circuit 320 detects the signal on SCL after the clock wake-up circuit 310 detects the start signal. If the signal on SCL remains high before the clock circuit is woken up, the signal hold circuit 320 may not perform any action. However, if it is detected that the signal on SCL becomes a low level, the signal hold circuit 320 will pull SCL down actively, thereby making the master wait by taking active operations mentioned above.

Specifically, the clock wake-up circuit 310 may include: a start signal detection circuit, configured to generate a start signal indication signal in response to detecting that the SCL signal is high and the SDA signal becomes low. The start signal detection circuit can be implemented by combinational logic gates. Here, since it takes time for the internal clock circuit to wake up, the start signal indication signal itself cannot be directly used as the wake-up signal. Thus, the clock wake-up circuit 310 needs a register for holding the start signal. Specifically, the clock wake-up circuit 310 further includes a first register, configured to generate a signal as the output signal of the clock wake-up circuit, in response to its set terminal receiving the start signal indication signal.

In an embodiment, the signal holding circuit 320 include an SCL falling edge detection circuit, configured to generate a falling edge indication signal in response to detecting the falling edge of the SCL signal. Similarly, the SCL falling edge detection circuit can be implemented by combinational logic gates. Since it is unknown when the clock circuit is awaken and SCL needs to be continuously pulled low before the clock circuit is awaken, the signal hold circuit 320 also needs a register for holding the falling edge indication signal. Specifically, the signal holding circuit 320 further includes: a second register, configured to generate a signal for pulling down the SCL, in response to receiving the output signal of the first register indicating the start signal is detected and the output signal of the SCL falling edge detection circuit indicating the falling edge is detected.

The first register and the second register can then be reset after the arrival of the first clock signal generated by the wake-up clock circuit.

In a preferred embodiment, the I2C wake-up circuit further includes: a deglitch circuit connecting to the SCL and the SDA, and configured to provide the SCL signal and the SDA signal to the clock wake-up circuit 310 after a glitch is removed.

In addition, since the I2C communication module operates under the control of the internal clock, when the I2C communication module starts to operate, it has missed the initial start signal on the I2C. Thus, the I2C wake-up circuit can further include: a start signal holding circuit, configured to make the I2C communication module receive the start signal according to the clock signal. For example, the start signal holding circuit can also be implemented by the first register above, which can send the registered valid information (that is, the registered start signal shown in FIG. 3) to the I2C communication module after the I2C communication module starts to work.

For example, the output of the first register can be ORed with the start signal detection circuit of the I2C communication module itself, so that the start signal previously registered by the I2C wake-up circuit can be detected by the start signal detection circuit of the I2C communication module itself.

For example, the output of the first register can be ORed with the start signal detection circuit of the I2C communication module itself, so that the start signal registered before the I2C wake-up circuit can prompt the I2C communication module to perform subsequent operations, which plays the same role as the start signal detect by the I2C communication module's own start signal detection circuit.

In addition to the "OR" logic, other methods can also be used to realize the wake-up of the I2C communication module 10 by the registered start signal. For example, in some embodiments, the registered start signal can be introduced into the I2C communication module 10 separately (i.e., without OR logic with start detection), and the wake-up of the I2C communication module 10 (as shown in FIG. 1 and FIG. 4) can be realized when the start signal is valid.

Specifically, after being woken up by the registered start signal, the I2C communication module can read outside address information from the SDA, just like the start signal detected by its own start signal detection circuit.

Figure 4:
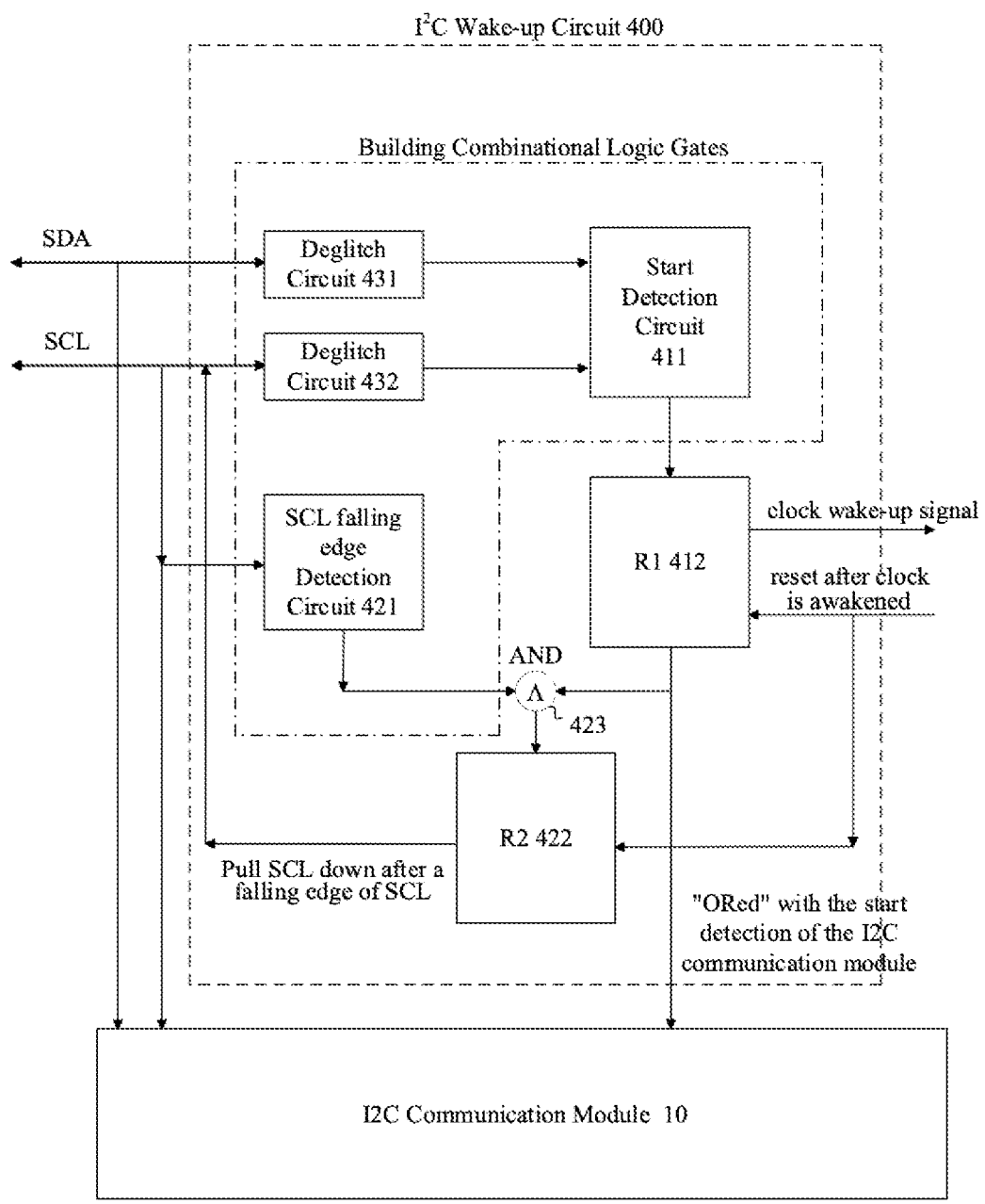
FIG. 4 shows a schematic diagram of the composition of an I2C wake-up circuit according to an embodiment of the present disclosure.

FIG. 4 shows a schematic diagram of the composition of an I2C wake-up circuit according to an embodiment of the present disclosure. The illustrated I2C wake-up circuit 400 can be regarded as a preferred embodiment of the I2C wake-up circuit 300 shown in FIG. 3.

As shown in the figure, the deglitch circuits 431 and 432 can be used to remove glitches from the signals on SDA and SCL respectively, thereby preventing false wake-up caused by unstable pin signals. The deglitch SDA and SCL signals can pass a start detection logic circuit built through a combination of logic gates (corresponding to the start signal detection circuit described above). If the start signal is detected, the first register (R1) 412 can be set. bit. Here, R1 can be a flip-flop with a set terminal, and the start signal indication signal detected by the start detection circuit 411 and output by the start signal can be used as the set signal, and the output obtained therefrom can be used to wake up the internal clock circuit (shown in FIG. 1, but not shown in FIG. 4) which is turned off in the low power mode. Specifically, the output of R1 412 can be provided to the internal analog circuit through the "OR" logic with the conventional clock enable signal. In other words, the clock wake-up signal of the I2C wake-up circuit 400 can be used to enable the internal clock circuit like a clock enable signal.

The start detection circuit 411 and R1 412 can be regarded as the clock wake-up circuit 310 of the I2C wake-up circuit 300 shown in FIG. 3. The signal holding circuit 320 of the I2C wake-up circuit 300 shown in FIG. 3 corresponds to the SCL falling edge detection circuit 421 and the second register (R2) 422 in FIG. 4. In one embodiment, the second register 422 needs to be pulled down after the start signal is detected and the falling edge of SCL is detected, thus the signal hold circuit 320 can also include a circuit for combining these two conditions, implemented as AND gate 423 in FIG. 4. However, since a continuous pull-down of SCL avoids data transfers (regardless of whether the master pulls SCL down), in another embodiment, the signal holding circuit 320 shown in FIG. 3 corresponds to the second register (R2) 422 in FIG. 4, that is, the second register (R2) 422 is pulled down after the start signal is detected (indicated by the output of R1 412), no matter whether the falling edge of SCL is detected or not.

Since it does not know when the master pulls down SCL after the start signal is sent, and when the internal clock signal of the slave can be woken up, the signal hold circuit in FIG. 4 needs to be able to deal with the following two situations: one is the slave's internal clock signal arrives before the master pulls down the SCL signal, and the other is that the slave's internal clock signal arrives later than the master pulls down the SCL signal.

Figure 5:
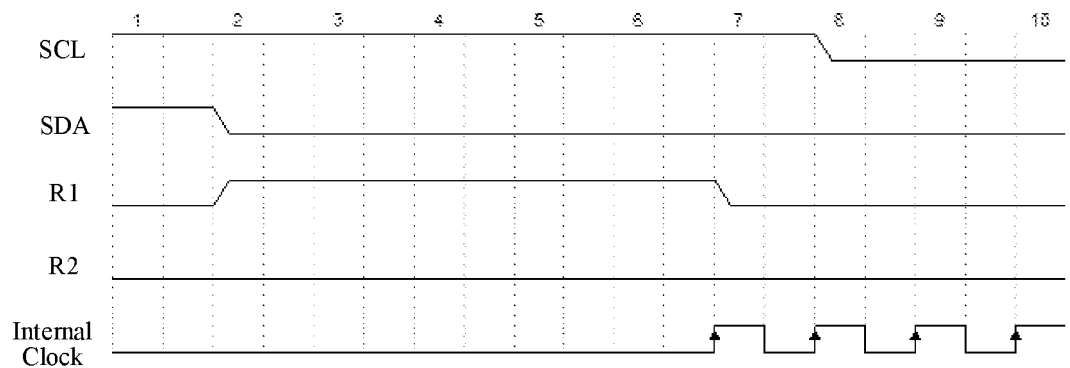
FIG. 5 shows a timing diagram when a internal clock wakes up before a master pulls SCL low.
Figure 6:
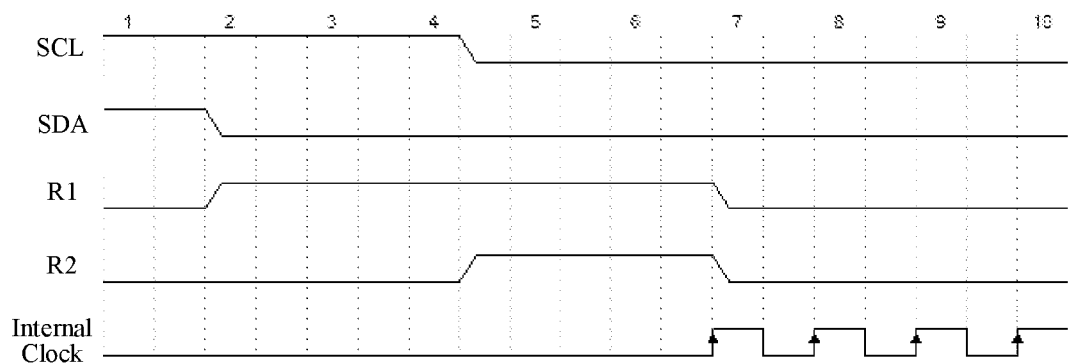
FIG. 6 shows a timing diagram when a internal clock wakes up later than a master pulls SCL low.

Specifically, FIG. 5 shows a timing diagram when the internal clock wakes up before the master pulls SCL low. FIG. 6 shows the timing diagram when the internal clock wakes up later than the master pulls SCL low.

The above two cases will be described below with reference to FIG. 5 and FIG. 6.

As shown in FIG. 5, at clock cycle 2, the master keeps SCL high while pulling SDA low, thus, the start detection circuit 411 detects the start signal, R1 jumps to be valid, and sends a wake-up clock signal to the internal clock circuit. Then, the internal clock wakes up at clock cycle 7 and generates an internal clock, and at this time SCL has not been pulled low under the control of the master, so the flip-flop R2 does not need to work, and the flip-flop R1 is reset at clock cycle 7 when the internal clock arrives. In this case, since the internal clock is generated before the arrival of falling edge of SCL controlled by the master, R2 does not need to pull down SCL, and the external master will not be forced in a waiting state by the slave to which the I2C wake-up circuit 400 belongs. Since the I2C communication module 10 starts to operate at clock cycle 7 when the internal clock is generated, it cannot detect the start signal at clock cycle 2 by itself. Thus, the output of R1 can be provided to the detection circuit of the I2C communication module 10, for example, the output of R1 is "ORed" with the start detection circuit in the I2C communication module 10, so that the start signal at clock cycle 2 can trigger the I2C communication module 10, which has just started to operate at clock cycle 7, avoids the master sending the start signal twice.

In the case where the master pulls SCL low before the internal clock is recovered, R2 needs to be actively involved. As shown in FIG. 6, at clock cycle 2, the master keeps SCL high while pulling SDA low, thus, the start detection circuit 411 detects the start signal, R1 jumps to be valid, and sends a wake-up clock signal to the internal clock circuit. Then, at clock cycle 4, the SCL signal is pulled low by the master. At this time, the SCL falling edge detection circuit 421 detects this falling edge, and together with the R1 output signal that has become valid at clock cycle 2, causes R2 to be set via the AND gate 423. Therefore, the set R2 can keep SCL pulled low after clock cycle 4, thereby making the master in a waiting state. Transmission from the external master (eg, address data after the start signal) is delayed if there is one. Until clock cycle 7, the internal clock circuit is awakened to generate the internal clock, so that the flip-flops R1 and R2 are reset, at this time SCL is released, and the external master can continue to send the data that was delayed at clock cycle 4. Since SCL is released, SCL can remain low for a period of time under the control of the master, and can jump high again under the control of the master, and start data transfer in conjunction with SDA (see the pattern in FIG. 2). Similarly, since the I2C communication module 10 starts to operate at clock cycle 7 when the internal clock is generated, it cannot detect the start signal at clock cycle 2 by itself. Thus, the output of R1 can be provided to the detection circuit of the I2C communication module 10, for example, the output of R1 is "ORed" with the start detection circuit in the I2C communication circuit 10, so that the start signal at clock cycle 2 can trigger the I2C communication circuit 10, which has just started to operate at clock cycle 7, avoids the master sending the start signal twice.

Therefore, the I2C wake-up circuit of the present disclosure wakes up the clock by detecting the start. In order to prevent data loss, after the master pulls down the SCL, the SCL will always be pulled down, and the SCL will be released after the arrival of a clock signal. Besides, the start signal can be transmitted to the I2C communication module, so that the normal communication of I2C will not be affected by the wake-up of the clock circuit.

In one embodiment, the present disclosure can also be implemented as an I2C wake-up method comprising: sending a clock wake-up signal to a clock circuit in response to detecting a start signal on a serial clock line SCL and a serial data line SDA; and holding the SDA in a state of not transmitting address information until a clock signal sent by the clock circuit that is awakened is received.

Specifically, the method comprises: in response to detecting that the SCL signal is high and the SDA signal becomes low, generating a start signal indication signal; in response to its set terminal receiving the start signal indication signal, generating an output signal as the clock wake-up signal.

Specifically, the holding step further comprises: continuously pulling down the SCL until the clock circuit is awakened. Specifically, the method comprises: in response to detecting a falling edge of the SCL signal, generating a falling edge indication signal; and in response to the falling edge indication signal and the output signal of the first register indicating that the start signal is detected, generating a signal for pulling down the SCL.

Therefore, regardless of whether the clock signal is generated earlier or later than the master pulls down the SCL signal, it can ensure that the wake-up I2C communication module obtains complete data information.

In another embodiment, the present disclosure can also be implemented as an electronic device including the I2C wake-up circuit as described above.

An I2C wake-up solution according to the present disclosure is disclosed above. This solution does not perform subsequent operations after determining that the address sent by the master matches the slave, but wakes up the clock when receiving the start signal on the I2C, and turns off the clock when the access ends. Therefore, normal data reception can be realized by simple hardware overhead such as combinational logic and two registers, each with a set terminal, and no specific address wake-up mechanism is required. In addition, the mechanism of the present disclosure that the clock is turned on when there is an access, and the clock is turned off when the access ends can save power consumption to the greatest extent.

Various embodiments of the present disclosure have been described above, and the foregoing descriptions are exemplary, not exhaustive, and not limiting of the disclosed embodiments. Numerous modifications and variations will be apparent to those of ordinary skill in the art without departing from the scope and spirit of the described embodiments. The terminology used herein was chosen to best explain the principles of the various embodiments, the practical application or improvement over the technology in the marketplace, or to enable others of ordinary skill in the art to understand the various embodiments disclosed herein.

What is claimed is:

1. An I2C wake-up circuit, configured to wake up an I2C communication module in a slave for I2C communication when an internal clock circuit of the slave is turned off, and comprising:
    a clock wake-up circuit, configured to send a clock wake-up signal to the internal clock circuit in response to detecting a start signal from a master on a serial clock line SCL and a serial data line SDA, wherein detecting the start signal corresponds to detecting the SCL signal being high while the SDA signal goes low; and
    a signal holding circuit, configured to detect the signal on SCL after the clock wake-up circuit detects the start signal and continuously pull down the SCL when detecting the SCL signal is pulled low by the master to make the master wait by holding the serial data line SDA in a state of not transmitting address information until a clock signal sent by the internal clock circuit that is awakened is received.

2. The I2C wake-up circuit of claim 1, wherein the clock wake-up circuit comprises:
    a start signal detection circuit, configured to generate a start signal indication signal in response to detecting that the SCL signal is high and the SDA signal goes low; and
    a first register, configured to generate an output signal as the clock wake-up signal in response to its set terminal receiving the start signal indication signal.

3. The I2C wake-up circuit of claim 2, wherein the signal hold circuit comprises:
    a SCL falling edge detection circuit, configured to generate a falling edge indication signal in response to detecting the falling edge of the SCL signal; and
    a second register, configured to generate a signal for pulling down the SCL in response to receiving the falling edge indication signal and the output signal of the first register indicating that the start signal is detected.

4. The I2C wake-up circuit of claim 2, wherein the signal hold circuit comprises:
    a second register, configured to generate a signal for pulling down the SCL in response to receiving the output signal of the first register indicating that the start signal is detected.

5. The I2C wake-up circuit of claim 3, wherein the first register and the second register are reset after the clock signal arrives.

6. The I2C wake-up circuit of claim 1, further comprising:
    a deglitch circuit, configured to connect to the SCL and the SDA, and provide the SCL signal and the SDA signal to the clock wake-up circuit after a glitch is removed.

7. The I2C wake-up circuit of claim 1, further comprising:
    a start signal holding circuit, configured to make the I2C communication module receive the start signal according to the clock signal.

8. The I2C wake-up circuit of claim 7, wherein,
    after being awakened by the start signal, the I2C communication module read the address information from the master on the SDA according to the clock signal sent by the internal clock circuit that is awakened.

9. An I2C wake-up method for waking up an I2C communication module in a slave for I2C communication when an internal clock circuit of the slave is turned off, wherein the method comprises the following steps:
sending a clock wake-up signal to the internal clock circuit in response to detecting a start signal from a master on a serial clock line SCL and a serial data line SDA, wherein detecting the start signal corresponds to detecting the SCL signal being high while the SDA signal goes low; and
detecting the signal on SCL after the start signal is detected and continuously pull down the SCL when detecting the SCL signal is pulled low by the master to make the master wait by holding the SDA in a state of not transmitting address information until a clock signal sent by the internal clock circuit that is awakened is received.

10. The I2C wake-up method of claim 9, wherein the sending step further comprises:
generating a start signal indication signal in response to detecting that the SCL signal is high and the SDA signal goes low; and
generating an output signal as the clock wake-up signal in response to receiving the start signal indication signal.

11. The I2C wake-up method of claim 10, wherein the holding step further comprises:
generating a falling edge indication signal in response to detecting the falling edge of the SCL signal; and
generating a signal for pulling down the SCL in response to receiving the falling edge indication signal and the output signal of a first register indicating that the start signal is detected.

12. An electronic device, comprising an I2C wake-up circuit, the I2C wake-up circuit, configured to wake up an I2C communication module in a slave for I2C communication when an internal clock circuit of the slave is turned off, and comprising:
a clock wake-up circuit, configured to send a clock wake-up signal to the internal clock circuit in response to detecting a start signal on a serial clock line SCL and a serial data line SDA, wherein detecting the start signal corresponds to detecting the SCL signal being high while the SDA signal goes low; and
a signal holding circuit, configured to detect the signal on SCL after the clock wake-up circuit detects the start signal and continuously pull down the SCL when detecting the SCL signal is pulled low by the master to make the master wait by holding the serial data line SDA in a state of not transmitting address information until a clock signal sent by the internal clock circuit that is awakened is received.

13. The electronic device of claim 12, wherein the clock wake-up circuit comprises:
a start signal detection circuit, configured to generate a start signal indication signal in response to detecting that the SCL signal is high and the SDA signal goes low; and
a first register, configured to generate an output signal as the clock wake-up signal in response to its set terminal receiving the start signal indication signal.

14. The electronic device of claim 13, wherein the signal hold circuit comprises:
a SCL falling edge detection circuit, configured to generate a falling edge indication signal in response to detecting the falling edge of the SCL signal; and
a second register, configured to generate a signal for pulling down the SCL in response to receiving the falling edge indication signal and the output signal of the first register indicating that the start signal is detected.

15. The electronic device of claim 12, further comprising:
a deglitch circuit, configured to connect to the SCL and the SDA, and provide the SCL signal and the SDA signal to the clock wake-up circuit after a glitch is removed.

16. The electronic device of claim 12, further comprising:
a start signal holding circuit, configured to make the I2C communication module receive the start signal according to the clock signal.

17. The electronic device of claim 16, wherein,
after being awakened by the start signal, the I2C communication module read the address information from the master on the SDA according to the clock signal sent by the internal clock circuit that is awakened.

* * * * *